(12) United States Patent
Inoue et al.

(10) Patent No.: US 7,626,234 B2
(45) Date of Patent: Dec. 1, 2009

(54) SEMICONDUCTOR DEVICE WITH SHALLOW TRENCH ISOLATION AND ITS MANUFACTURE METHOD

(75) Inventors: Kengo Inoue, Kawasaki (JP); Hiroyuki Ota, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 225 days.

(21) Appl. No.: 11/429,962

(22) Filed: May 9, 2006

(65) Prior Publication Data

US 2006/0255426 A1 Nov. 16, 2006

Related U.S. Application Data

(62) Division of application No. 10/882,260, filed on Jul. 2, 2004, now Pat. No. 7,211,480.

(30) Foreign Application Priority Data

Mar. 4, 2004 (JP) ............................. 2004-060210

(51) Int. Cl.
*H01L 29/76* (2006.01)
(52) U.S. Cl. ...................... 257/374; 438/424
(58) Field of Classification Search ................ 438/221, 438/424, 431, 435, 437, 689, 700; 257/E21.545, 257/E21.546, E21.548, E21.549, 374
See application file for complete search history.

(56) References Cited

U.S. PATENT DOCUMENTS

| 6,333,274 | B2 | 12/2001 | Akatsu et al. | |
|---|---|---|---|---|
| 6,333,547 | B1 | 12/2001 | Tanaka et al. | |
| 6,436,790 | B2 | 8/2002 | Ito | |
| 6,531,377 | B2 * | 3/2003 | Knorr et al. | ................ 438/435 |
| 6,790,723 | B2 | 9/2004 | Tanaka et al. | |
| 6,798,038 | B2 | 9/2004 | Sato et al. | |

(Continued)

FOREIGN PATENT DOCUMENTS

JP 11-297811 A 10/1999

(Continued)

OTHER PUBLICATIONS

The State Intellectual Property Office of the People's Republic of China dated Apr. 21, 2006 issued corresponding to Japanese Patent Application.

(Continued)

*Primary Examiner*—David Vu
(74) *Attorney, Agent, or Firm*—Westerman, Hattori, Daniels & Adrian, LLP

(57) ABSTRACT

A semiconductor device manufacturing method includes the steps of: (a) forming a stopper layer for chemical mechanical polishing on a surface of a semiconductor substrate; (b) forming an element isolation trench in the stopper layer and the semiconductor substrate; (c) depositing a nitride film covering an inner surface of the trench; (d) depositing a first oxide film through high density plasma CVD, the first oxide film burying at least a lower portion of the trench deposited with the nitride film; (e) washing out the first oxide film on a side wall of the trench by dilute hydrofluoric acid; (f) depositing a second oxide film by high density plasma CVD, the second oxide film burying the trench after the washing-out; and (g) removing the oxide films on the stopper layer by chemical mechanical polishing.

9 Claims, 7 Drawing Sheets

U.S. PATENT DOCUMENTS 6,828,213 B2 * 12/2004 Mehrad et al. .............. 438/435
2003/0199151 A1 10/2003 Ho et al.

FOREIGN PATENT DOCUMENTS

| JP | 11-297812 A | 10/1999 |
| JP | 2001168092 A | 6/2001 |
| JP | 2001319968 A | 11/2001 |
| JP | 2002208629 A | 7/2002 |

OTHER PUBLICATIONS

Japanese Office Action dated Sep. 29, 2009 issued in corresponding Japanese patent Application No. 2004060210 (w/Partial Translation).

* cited by examiner

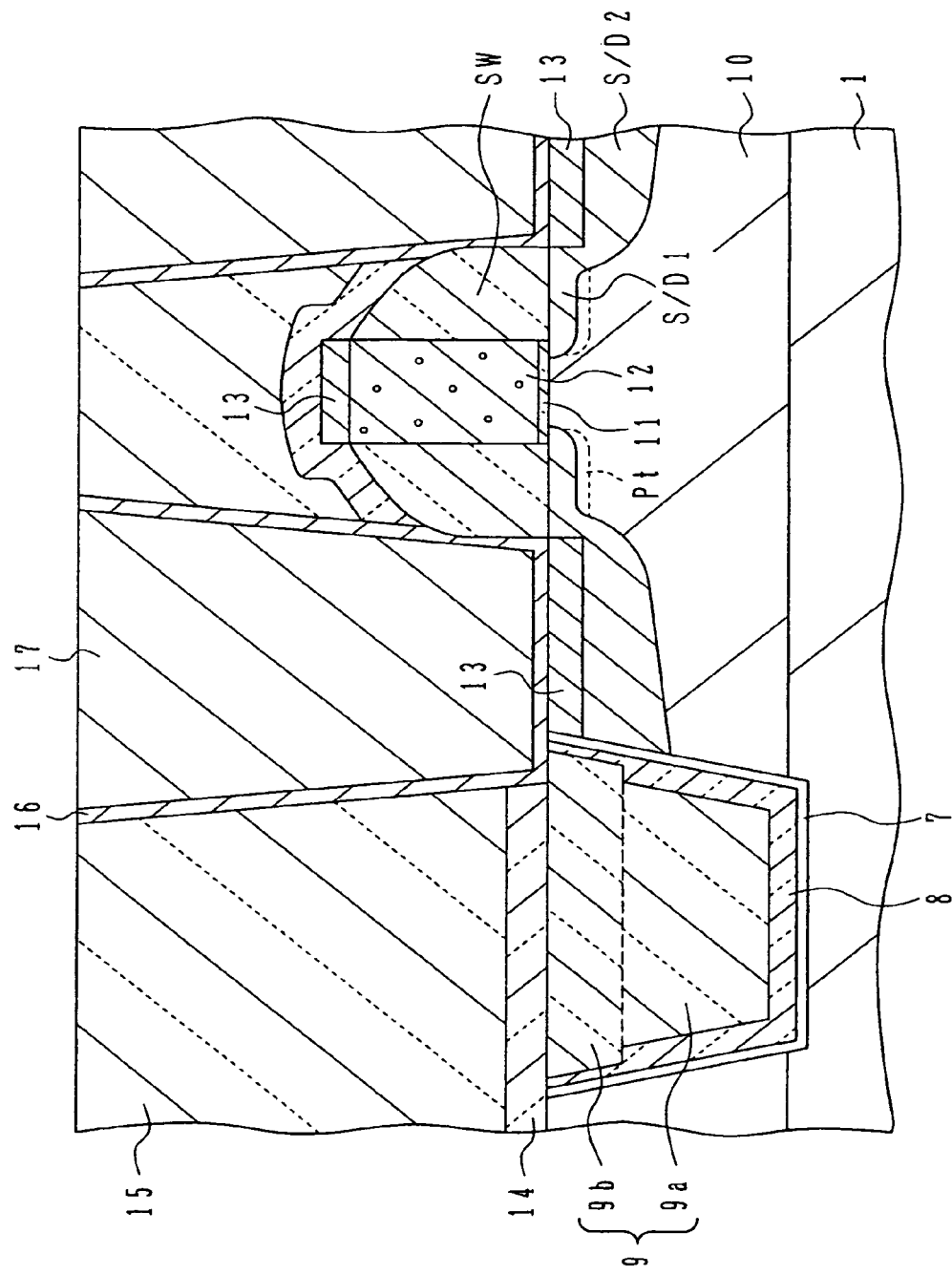

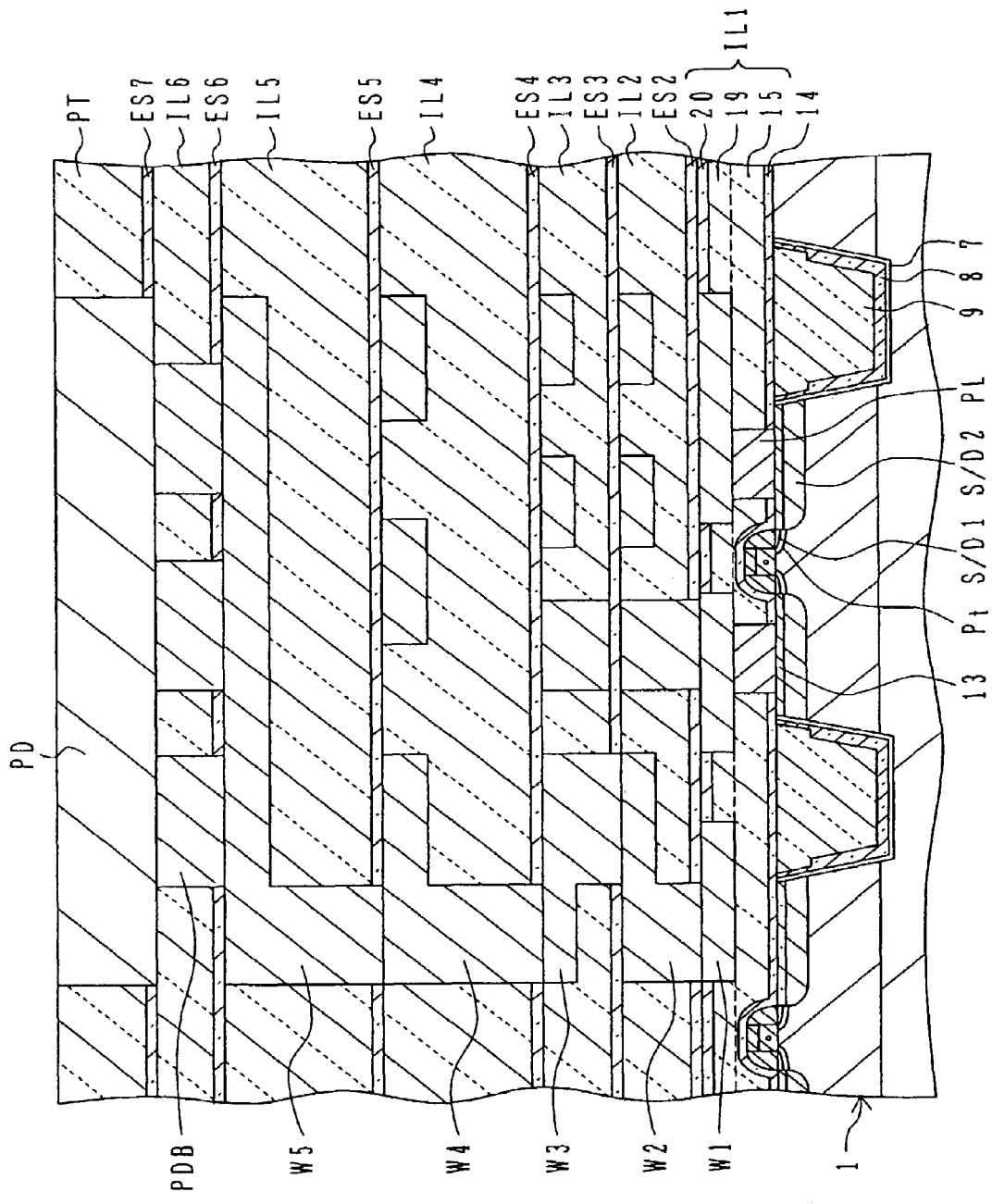

SEMICONDUCTOR DEVICE WITH SHALLOW TRENCH ISOLATION AND ITS MANUFACTURE METHOD

This application is a divisional of prior application Ser. No. 10/882,260 filed Jul. 2, 2004, the benefit of which is claimed under 35 U.S.C. §120.

CROSS REFERENCE TO RELATED APPLICATION

This application is based on and claims priority of Japanese Patent Application No. 2004-060210 filed on Mar. 4, 2004, the entire contents of which are incorporated herein by reference.

BACKGROUND OF THE INVENTION

A) Field of the Invention

The present invention relates to a semiconductor device and its manufacture method, and more particularly to a semiconductor device having shallow trench isolation (STI) and its manufacture method.

B) Description of the Related Art

Local oxidation of silicon (LOCOS) is known as one of element isolation methods for semiconductor devices.

According to the technique of local oxidation of silicon, after a silicon oxide film is formed on a silicon substrate as a buffer layer, a silicon nitride film is formed as an oxidation preventing mask layer, and after the silicon nitride film is patterned, the surface of the silicon substrate is thermally oxidized via the silicon oxide film.

While the silicon substrate is thermally oxidized, oxidation seeds such as oxygen and moisture intrude also into the buffer silicon oxide film under the silicon nitride film so that the silicon substrate surface under the silicon nitride film is also oxidized and silicon oxide regions called bird's beaks are formed. The regions where the bird's beaks are formed cannot be used substantially as an element forming region (active region) so that an area of the element forming region becomes small.

If a substrate surface is thermally oxidized after a silicon nitride film having openings of various sizes is formed, the thickness of a silicon oxide film formed on the silicon substrate under an opening having a narrow size is thinner than that of a silicon oxide film formed on the silicon substrate under an opening having a broad size. This phenomenon is called thinning.

As semiconductor devices are made finer, the area of the region not used as the element forming region increases in the whole region of a semiconductor substrate, because of bird's beaks and thinning. Namely, a ratio of narrowing the element forming region increases, hindering high integration of semiconductor devices.

A trench isolation (TI) technique is known as the technique of forming an element isolation region. With this technique, a trench is formed under a semiconductor substrate surface, and insulator or polysilicon is buried in the trench. This method has been used conventionally with bipolar transistor LSI's which require deep element isolation regions.

In order to eliminate both the bird's beak and thinning, trench isolation has been applied widely to MOS transistor LSI's. Since a MOS transistor LSI does not require element isolation as deep as that of a bipolar transistor, element isolation can be realized by a relatively shallow trench of about 0.1 to 1.0 µm deep. This structure is called shallow trench isolation (STI).

STI forming processes will be described with reference to FIGS. 5A to 5H.

As shown in FIG. 5A, on the surface of a silicon substrate 1, a silicon oxide film 2 having a thickness of, for example, 10 nm is formed by thermal oxidation. On this silicon oxide film 2, a silicon nitride film 3, e.g., 100 to 150 nm thick is formed by chemical vapor deposition (CVD). The silicon oxide film 2 functions as a buffer layer for relaxing a stress between the silicon substrate 1 and silicon nitride film 3. The silicon nitride film 3 functions as a stopper layer in a later polishing process.

A resist pattern 4 is formed on the silicon nitride film 3. An opening defined by the resist pattern 4 defines the region where an element forming region is formed. The region of the silicon substrate under the resist pattern 4 becomes an active region where an element is formed.

By using the resist pattern 4 as an etching mask, the silicon nitride film 3 exposed in the opening, the silicon oxide film 2 under the silicon nitride film and the silicon substrate 1 under the silicon oxide film are etched by reactive ion etching (RIE) to a depth of about 0.5 µm to form a trench 6.

As shown in FIG. 5B, the silicon substrate surface exposed in the trench 6 is thermally oxidized to form a thermally oxidized silicon film, e.g., 10 nm thick.

As shown in FIG. 5C, a silicon oxide film 9 burying the trench is formed on the silicon substrate, for example, by high density plasma (HDP) CVD. In order to make dense the silicon oxide film 9 to be used as the element isolation region, the silicon substrate is annealed, for example, in a nitrogen atmosphere at 900 to 1100° C.

As shown in FIG. 5D, by using the silicon nitride film 3 as a stopper, an unnecessary silicon oxide film 9 is removed starting from the top surface thereof by chemical mechanical polishing (CMP) or reactive ion etching (RIE). The silicon oxide film 9 is left only in the trench defined by the silicon nitride film 3. Annealing may be performed at this stage in order to make dense the silicon oxide film.

As shown in FIG. 5E, the silicon nitride film 3 is removed by hot phosphoric acid. Next, the buffer silicon oxide film 2 on the surface of the silicon substrate 1 is removed by dilute hydrofluoric acid. At this time, the silicon oxide film 9 buried in the trench is also etched.

As shown in FIG. 5F, the surface of the silicon substrate 1 is thermally oxidized to form a sacrificial silicon oxide film 22 on the substrate surface. Impurity ions of a desired conductivity type are implanted into the surface layer of the silicon substrate 1 via the sacrificial silicon oxide film 22 and activated to form a well 10 of the desired conductivity type. The sacrificial silicon oxide film 22 is thereafter removed by dilute hydrofluoric acid. While the sacrificial silicon oxide film 22 is removed, the silicon oxide film 9 is also etched.

As shown in FIG. 5G, the exposed surface of the silicon substrate is thermally oxidized to form a silicon oxide film 11 having a desired thickness which is used as a gate insulating film. A polysilicon film 12 is deposited on the silicon substrate 1 and patterned to form a gate electrode.

As shown in FIG. 5H, impurity ions having the conductivity type opposite to that of the well 10 are implanted and activated to form source/drain regions S/D1. If necessary, side wall spacers SW are formed on the side walls of the gate electrode, and impurity ions having the conductivity type opposite to that of the well 10 are implanted again and activated to form high concentration source/drain regions S/D2.

As silicon oxide is buried in the trench and an annealing process is performed in order to make dense the silicon oxide film 9, the silicon oxide film 9 becomes dense and is also compressed so that the element forming region surrounded by this silicon oxide film 9 receives a compression stress.

As the compression stress is applied, the mobility of electrons in the active region of the silicon substrate 1 lowers greatly. A saturation drain current therefore lowers. As the active region becomes narrow because of finer elements, the influence of the compression stress becomes large.

As shown in FIG. 5G, if the shoulders of the element isolation region 9 are etched and divots are formed under the gate electrode, the gate electrode surrounds not only the upper surface of the element forming region, but also the side walls of the shoulders of the element forming region of the silicon substrate. When a voltage is applied to the gate electrode having this shape, an electric field concentrates upon the shoulders of the element forming region so that a transistor having a lower threshold voltage is formed. This parasitic transistor forms the hump characteristics on the IV characteristics.

As shown in FIG. 5H, an interlayer insulating film IL1 including an etch stopper layer is formed covering the gate electrode, and contact holes are formed reaching the source/drain regions S/D2. Conductive plugs PL are buried in the contact holes. In this case, if divots are being formed in STI under the contact holes, the contact holes are formed deeper than the active region surfaces. Therefore, the distance between the conductive plugs PL and the well 10 under the source/drain regions S/D2 becomes short, resulting in a possibility of leak current by tunneling or the like.

Japanese Patent Laid-open Publication No. HEI-11-297812 proposes the following method. In order to suppress the formation of divots while the stopper nitride film is etched and removed and in order to prevent the hump characteristics and leak current, a silicon nitride film is formed on a silicon oxide film formed on the inner surface of a trench, a mask material is once filled in the trench, and the mask material is etched so that the surface level of the mask material in the trench becomes lower than the surface level of the semiconductor substrate, and the exposed silicon nitride film on the upper inner surface of the trench is removed.

As the opening of a shallow trench becomes narrow, it becomes difficult to completely bury the inside of the trench with an insulating film. A seam may be formed at the interface of the insulating film or a void may be formed in the insulating film. If a seam or void exists, the void may be exposed during etching so that a morphology abnormality may occur or the manufacture yield at later processes may be lowered.

Japanese Patent Laid-open Publication No. HEI-11-297811 proposes the following method. A nitride film is deposited on the surface of a semiconductor substrate, and a trench is formed through etching using a resist mask. The exposed surface is oxidized and a nitride film is deposited thereon, and thereafter a first TEOS film is deposited in the trench. After the first TEOS film is etched back through wet etching, a second TEOS film is deposited in the trench.

Although element isolation by STI is suitable for miniaturization, there are problems inherent to STI. Various problems arise if a region is formed which has the STI surface lower than the active region surface. New technologies have been desired which can suppress the problems inherent to STI.

SUMMARY OF THE INVENTION

An object of this invention is to provide a manufacture method for semiconductor devices using STI capable of realizing good transistor characteristics.

Another object of the present invention is to provide a semiconductor device having good transistor characteristics.

According to one aspect of the present invention, there is provided a semiconductor device manufacturing method includes the steps of: (a) forming a stopper layer for chemical mechanical polishing over a surface of a semiconductor substrate; (b) forming an element isolation trench in the stopper layer and the semiconductor substrate; (c) depositing a nitride film covering an inner surface of the trench; (d) depositing a first oxide film through high density plasma oxidation, the first oxide film burying at least a lower portion of the trench deposited with the nitride film; (e) washing out the first oxide film over a side wall of the trench by hydrofluoric acid; (f) depositing a second oxide film by high density plasma oxidation, the second oxide film burying the trench after the washing-out; and (g) removing the oxide films over the stopper layer by chemical mechanical polishing.

According to another object of the present invention, there is provided a semiconductor device comprising: a semiconductor substrate; an element isolation trench defining an active region in the semiconductor device; a nitride film covering an inner wall of the element isolation trench and having a step making an upper portion of the nitride film thin from an intermediate depth of the inner wall; and a high density plasma oxide film burying a space defined by the nitride film in the element isolation trench.

A compression stress of the high density plasma oxide film is relaxed by a tensile stress of the silicon nitride film, so that drain current can be increased. A high density plasma oxidation process is executed twice or more and the oxide film on the side wall is removed by a wash-out process inserted between the high density plasma oxidation processes, so that the trench can be buried with the insulating film. Since the nitride film is left on the side wall, divots are prevented from being formed on the side areas of an active region, and the generation of hump and the increase in leak current of a transistor formed in the active region can be suppressed.

BRIEF DESCRIPTION OF THE DRAWINGS

FIG. 3 is a cross sectional view showing the structure of a semiconductor element formed in an active region.

FIG. 4 is a cross sectional view schematically showing the structure of a semiconductor integrated circuit device.

DESCRIPTION OF THE PREFERRED EMBODIMENTS

FIGS. 1A to 1G are cross sectional views of a semiconductor substrate illustrating the main processes of a method of manufacturing a semiconductor device according to an embodiment of the invention.

Figure 1A:
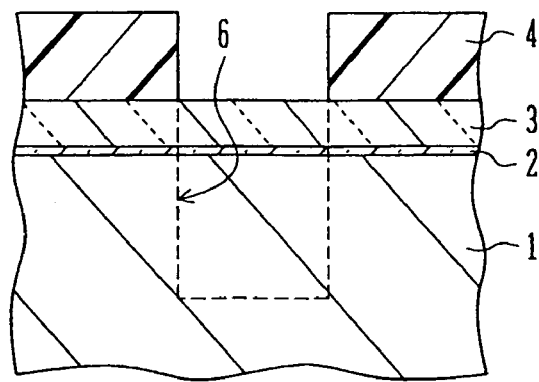
FIGS. 1A to 1G are cross sectional views illustrating an STI forming method according to an embodiment of the present invention.

As shown in FIG. 1A, the surface of a silicon substrate 1 is wet oxidized at 800° C. to form a buffer oxide film 2 of about 5 nm thick. Next, a silicon nitride layer 3 is formed having a thickness of, for example, 112 nm by chemical vapor deposition (CVD) at a substrate temperature of 775° C. This silicon nitride layer 3 provides a function of a stopper layer during chemical mechanical polishing (CMP). CVD for the silicon nitride layer may use, for example, dichlorosilane and ammonia or the like as the source materials.

A photoresist mask 4 is formed on the silicon nitride layer 3. This photoresist mask 4 defines a pattern on the active region where an element is formed and has an opening in the region where an element isolation is formed. By using the photoresist pattern 4 as an etching mask, the silicon nitride layer 3, silicon oxide layer 2 and substrate 1 are etched to form a trench 6 for element isolation (shallow trench isolation, STI).

The space between semiconductor elements is very narrow because of high integration of recent semiconductor devices. The width of an STI trench is therefore narrow. For example, a trench having a depth of 370 nm is formed at the width of 140 nm.

The photoresist pattern 4 may be extinguished during this etching process. After the photoresist pattern 4 extinguishes, the pattern of the silicon nitride layer 3 functions a hard mask. If the photoresist pattern 4 is left, it is removed after etching.

Figure 1B:
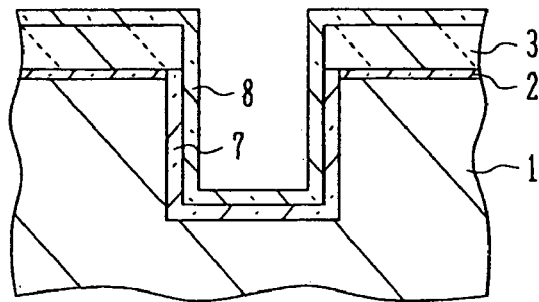

As shown in FIG. 1B, a thermally oxidized liner oxide film 7 of 5 nm to 10 nm thick is formed on the surface of the silicon substrate exposed in the trench, by dry oxidation, wet oxidation or hydrochloric acid oxidation. After the thermally oxidized liner oxide film 7 is formed, a silicon nitride liner film 8 is deposited by CVD on the substrate surface including the trench surface. The source gases may be dichlorosilane and ammonia, bistertialbutylaminosilane (BTBAS) and ammonia, or the like.

The thicker the silicon nitride film, the better, in order to exhibit a high tensile stress cancelling out a compression stress of the silicon oxide film generated by high density plasma oxidization. In order to allow an oxide film to be buried at a later process, the thickness of the silicon nitride liner film 8 is set so that the width of 60 nm or wider is left at the frontage of the trench after the nitride film was formed. In the case of the trench having a width of 140 nm, the silicon nitride film 8 having a thickness of 40 nm or thinner (e.g., 30 nm to 40 nm) is deposited to ensure the frontage having a width of 60 nm or wider.

There is the data that it is preferable to set the thickness of the silicon nitride liner layer to 8 nm or thinner or 20 nm or thicker in order to suppress peeling or separation of STI. For example, by using dichlorosilane and ammonia as source gases, a silicon nitride film having a thickness of 20 nm or thicker can be formed at a substrate temperature of 650° C. By using BTBAS and ammonia as source gases, a silicon nitride film having a thickness of 6 nm can be formed at a substrate temperature of 580° C.

Figure 1C:
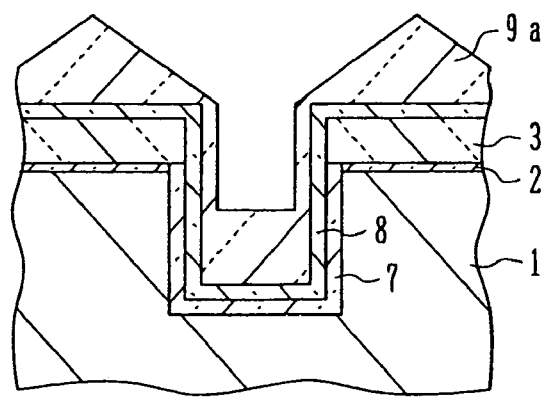

As shown in FIG. 1C, an oxide film is deposited by high density plasma (HDP) CVD in the trench formed with the silicon nitride liner film 8 to form a first oxide film 9a. For example, the first high density plasma oxide film 9a is deposited to a thickness of 140 nm at the flat surface, by supplying a high frequency RF power of 3200 W to the upper electrode and a low frequency RF power of 2100 W to the lower electrode, while silane of 120 cc, oxygen of 160 cc and He of 500 cc are flowed as source gases.

Although the oxide film 9a is deposited from the bottom of the trench, it is difficult to prevent the side wall of the oxide film in the upper trench area from gradually extending. Even if a trench having an aspect ratio of, for example, over 3 is to be buried by one high density plasma oxidation, a void is likely to be formed in the upper trench area.

Figure 1D:
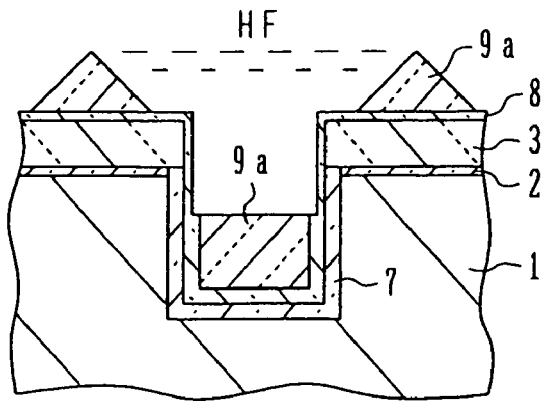

As shown in FIG. 1D, after the trench is buried to the intermediate depth thereof, preferably to the half depth or more, wash-out is performed by dilute hydrofluoric acid. Dilute hydrofluoric acid contains water 10 to 100 times as much as hydrofluoric acid. This wash-out removes the oxide film formed on the side wall extending in the trench upper area. As the oxide film 9a is etched, the underlying nitride film 8 is exposed. Since the silicon nitride film deposited by CVD contains H, it is etched by hydrofluoric acid.

For example, as the dilute hydrofluoric acid solution for wash-out, YGH is used which is a mixture of 0.2% HF (Y), $H_2O_2+NH_3+H_2O$=1:2:110 (G) and $H_2O_2+HCL+H_2O$=1:2:110 (H), and etching is performed at an etching amount corresponding to a thickness of 14 nm of the thermally oxidized film.

Figure 2:
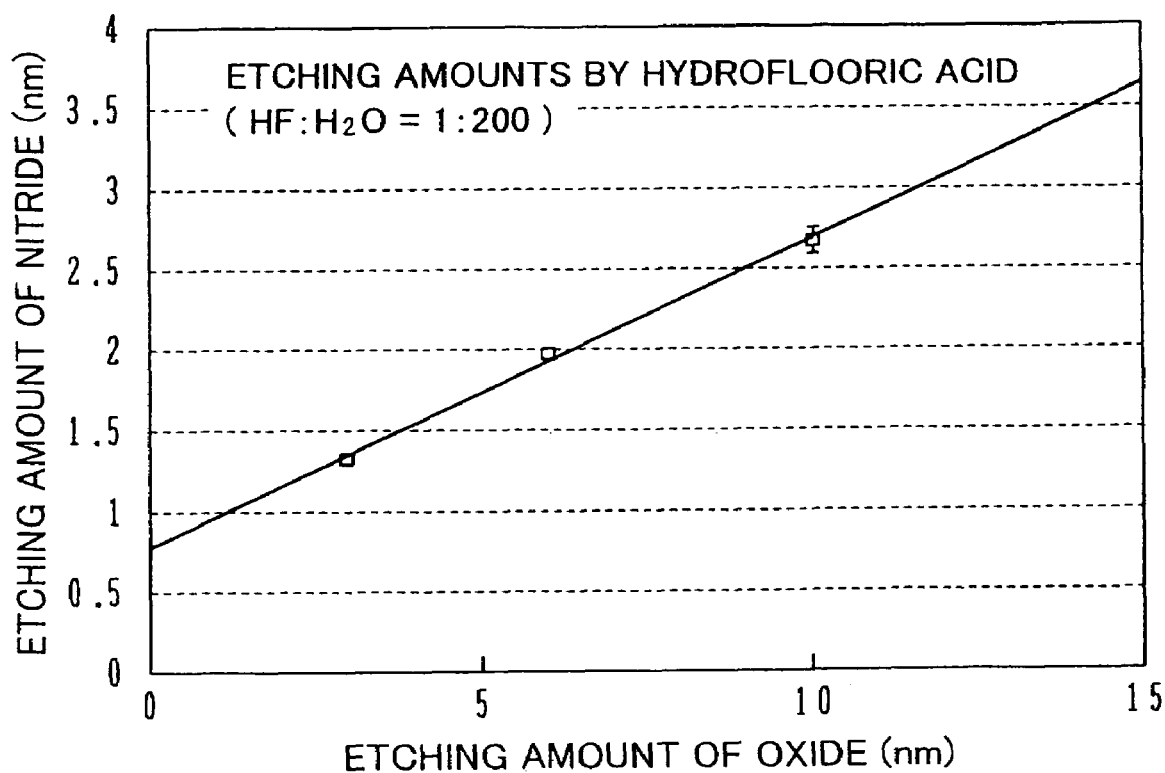
FIG. 2 is a graph showing the relation of the etching rate between an oxide film and a nitride film etched by dilute hydrofluoric acid.
Figure 5A:
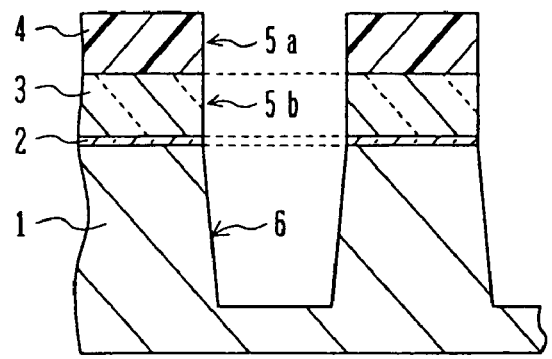
FIGS. 5A to 5H are cross sectional views illustrating an STI forming method according to a conventional technique.
Figure 5B:
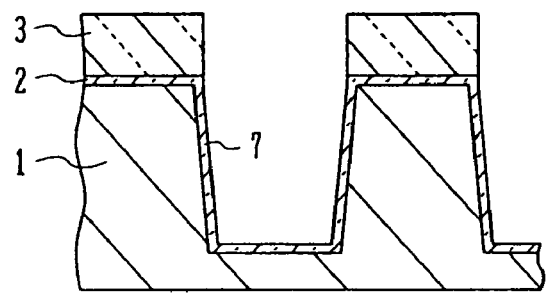
Figure 5C:
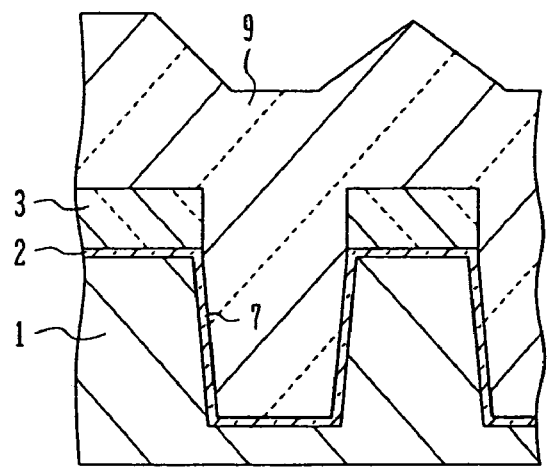
Figure 5D:
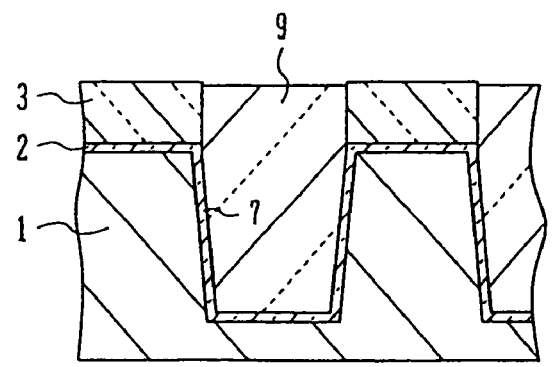
Figure 5E:
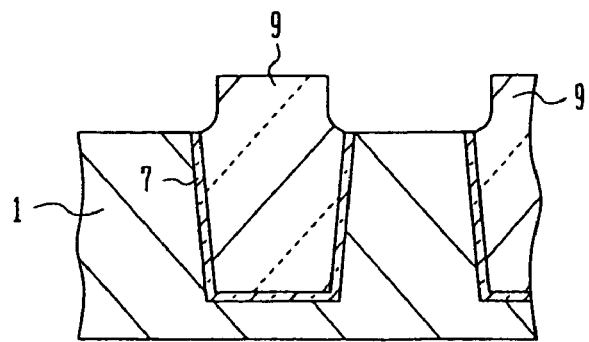
Figure 5F:
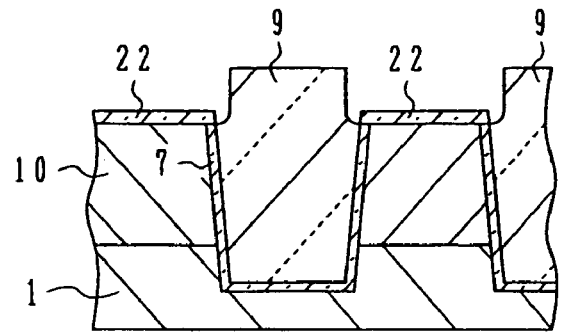
Figure 5G:
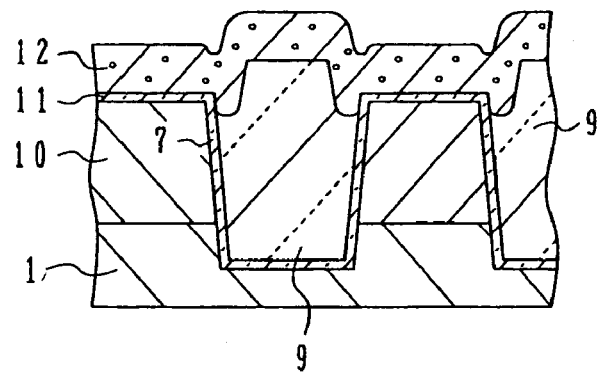
Figure 5H:
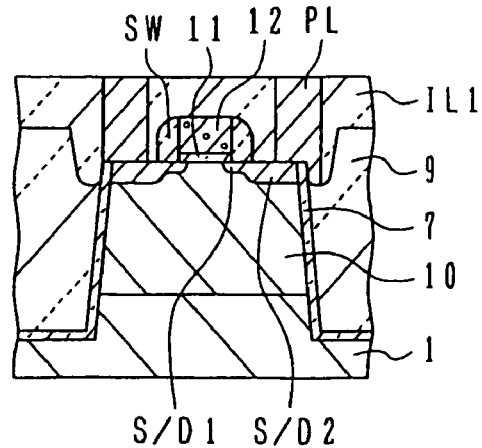

FIG. 2 is a graph showing a comparison of an etching amount between an oxide film and a nitride film etched by dilute hydrofluoric acid. Measured plots are almost on a straight line. For example, if an oxide film of 10 nm thick is etched, a nitride film is etched by about 2.7 nm assuming that the nitride film exists. By control etching which controls the etching time of dilute hydrofluoric acid, the silicon nitride film 8 is left by a thickness of, for example, about 5 nm. By leaving some of the silicon nitride film 8, it is possible to suppress divots from being formed at a later process.

If the thickness of the upper level nitride film 8 is set to 7 nm or thinner, during the etching by hot phosphoric acid after chemical mechanical polishing (CMP), it is possible to prevent the nitride film 8 in the trench from being etched. Hot phosphoric acid is hard to enter a gap of 7 nm or thinner because it is relatively viscous liquid. If the thickness of the nitride liner film is set to 7 nm or thinner in its upper area, during the etching process for the silicon nitride film by hot phosphoric acid after STI is formed, even if the upper end portion of the nitride liner film is etched the etching will not progress further because hot phosphoric acid is hard to permeate into the nitride liner film.

Figure 1E:
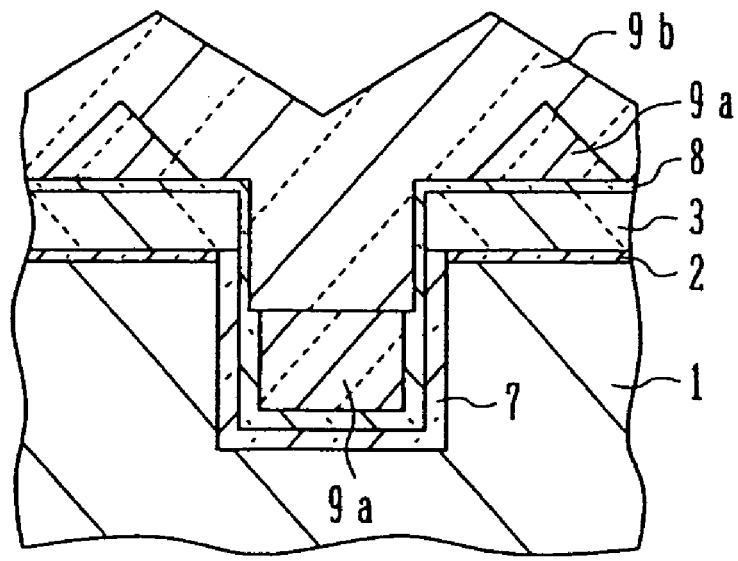

As shown in FIG. 1E, a second oxide film 9b is deposited by high density plasma on the substrate with the oxide film on the upper side wall of the trench being removed. Since the oxide film on the side wall is removed, the trench can be buried properly without forming a void, seam or the like.

The second high density plasma oxidation is performed by a thickness of about 265 nm by using the same source gases and RF powers as those of the first high density plasma oxidation. A relatively thick oxide film is deposited in order to bury the trench reliably.

Figure 1F:
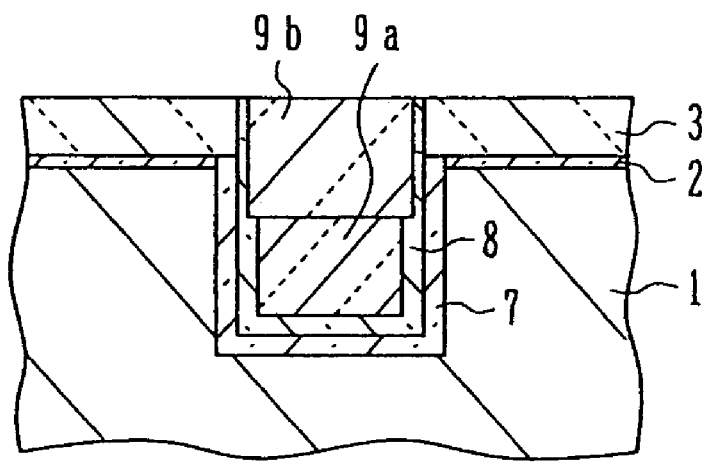

As shown in FIG. 1F, the high density plasma oxide films 9b and 9a (and nitride liner film 8) deposited on the nitride film 3 are removed by chemical mechanical polishing. A portion of the stopper nitride film 3 may be polished. After CMP, annealing is performed at a temperature of, for example, 1000° C. to make dense the oxide film and ensure the tensile stress of the nitride film.

Figure 1G:
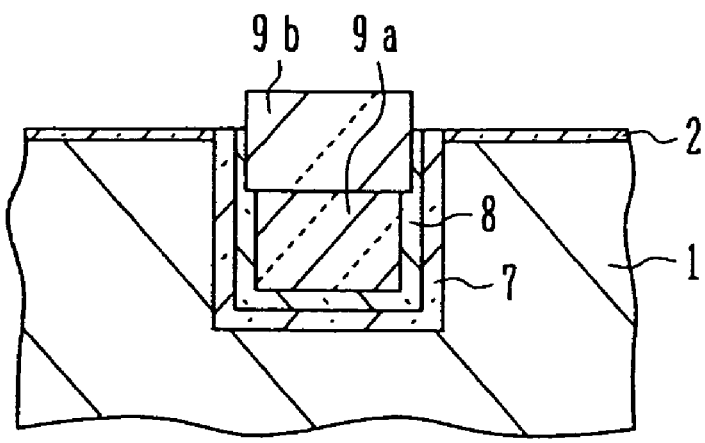

As shown in FIG. 1G, the silicon nitride film 3 functioned as the stopper layer is removed by hot phosphoric acid. If the upper thickness of the silicon nitride film 8 on the STI side wall formed as the liner layer is 7 nm or thinner, hot phosphoric acid is hard to permeate into this narrow width and etching will not progress in the nitride liner film.

Thereafter, the buffer silicon oxide film 2 is etched and removed, a thermally oxidized sacrificial film is formed, and thereafter ions are implanted to form a well. The thermally oxidized sacrificial film is etched and removed, and a thermally oxidized film is formed as a gate insulating film. While the oxide film is etched, the liner oxide film 7 is also etched in some cases. As the thickness of the oxide film is set to about 5 nm or thinner, wet etchant such as dilute hydrofluoric acid is hard to permeate so that etching the liner oxide film 7 can be suppressed. Since the liner nitride film 8 is left on the STI surface, divots can be suppressed from being formed during the etching process.

FIG. 3 is a cross sectional view of a MOS transistor formed in the active region surrounded and defined by the element isolation region. A p-type well 10 is formed in an active region of a p-type silicon substrate 1. An n-type well is also formed in another active region. After a through oxide film is removed, a gate insulating film 11 is formed on the surface of the active region by thermal oxidation, and a gate electrode layer 12 of polysilicon is formed on the gate insulating film 11. After the gate electrode layer 12 is patterned, n-type impurity ions are implanted in order to form source/drain regions S/D1 as extensions. Pocket regions Pt may be formed surrounding the extensions by implanting p-type impurity ions.

A silicon oxide layer or the like is deposited on the substrate surface, and anisotropically etched by reactive ion etching (RIE) to leave side wall spacers SW only on the side walls of the gate electrode 12. At this stage, n-type impurity ions are again implanted to form high concentration source/drain regions S/D2. On the substrate surface, for example a Co film is deposited to from a cobalt silicide film 13 on the silicon surface by a salicide reaction. An unreacted Co film is washed out to form a low resistance cobalt silicide film 13 by a secondary reaction.

A silicon nitride film 14 functioning as an etch stopper is formed on the substrate surface. On this film, an oxide film 15 functioning as an interlayer insulating film is deposited by CVD. The oxide film 15 may be a PSG film, a BPSG film, a plasma TEOS oxide film, a high density plasma oxide film or the like. After the surface of the interlayer insulating film 15 is planarized, contact holes are formed and a glue layer 16 such as a Ti/TiN laminated layer is deposited in the contact holes by sputtering or CVD. If the contact holes extend to the STI region as shown in FIG. 3 and divots exist near the border of the STI region, the contact metal extends downward surrounding the shoulders of the active region. After the glue layer 16 is deposited, for example W is deposited by CVD to form conductive plugs 17. Unnecessary metals on the interlayer insulating film are removed by CMP or the like.

In the above description, although an n-channel MOS transistor is formed by way of example, a p-channel MOS transistor can be formed by similar processes. In this case, the conductivity type of impurities is inverted from n-type to p-type and vice versa.

In the description of the above embodiment, the depth of STI is set to 370 nm and the width is set to 140 nm, this STI being used for a high speed and low voltage device. If a device requires a higher voltage and does not require a particular high speed, the trench width is set to about 200 nm and the depth is set to 370 nm same as the high speed and low voltage device. If the trench width is 200 nm and the trench frontage is narrower than 120 nm after the liner nitride film is formed, it is difficult to bury the trench by one high density plasma oxidation process. As in the above embodiment, since two high density plasma oxidation processes are executed, the trench can be buried appropriately.

FIG. 4 is a schematic cross sectional view showing the structure of a semiconductor integrated circuit device. A semiconductor substrate 1 is formed with p-wells and n-wells, an n-channel MOS transistor is formed in the p-well, and a p-channel MOS transistor is formed in the n-well. In the structure shown in FIG. 4, pocket regions Pt of an opposite conductivity type are formed surrounding source/drain regions S/D1 as extensions. A cobalt silicide layer 13 is formed on the silicon surface, and a silicon nitride layer 14 covers the cobalt silicide layer 13. Conductive plugs PL are buried through an interlayer insulating film 15. An interlayer insulating film 19 is formed on the interlayer insulating film 15, and an etching stopper layer 20 is formed on the interlayer insulating film 19. Trenches are formed through the etching stopper layer 20 and interlayer insulating film 19, and first wiring layers W1 of copper or the like are buried in the trenches. An etching stopper layer ES2 having an oxygen intercepting function covers the surface of the first wiring layers W1, a second interlayer insulating film IL2 is stacked, and second wiring layers W2 of a dual damascene structure are formed. An etching stopper layer ES3 having an oxygen intercepting function covers the surface of the second wiring layers W2, a third interlayer insulating film IL3 is stacked, and third wiring layers W3 of the dual damascene structure are formed through the third interlayer insulating film IL3 and third etching stopper layer ES3. An etching stopper layer ES4 having an oxygen intercepting function covers the surface of the third wiring layers W3, a fourth interlayer insulating film IL4 is stacked, and fourth wiring layers W4 of the dual damascene structure are formed. An etching stopper layer ES5 having an oxygen intercepting function covers the surface of the fourth wiring layers W4, a fifth interlayer insulating film IL5 is stacked, and fifth wiring layers W5 of the dual damascene structure are formed through the fifth interlayer insulating film IL5 and fifth etching stopper layer ES5. An etching stopper layer ES6 having an oxygen intercepting function covers the surface of the fifth wiring layers W5, and a sixth interlayer insulating film IL6 is stacked on the fifth wiring layers W5. Copper wiring plugs PDB as the base of a pad are buried through the sixth interlayer insulating film IL6 and sixth etching stopper layer ES6. A pad PD made of, for example, aluminum is formed on the pad base PDB. In the region other than the pad, a seventh etching stopper layer ES7 is formed on the sixth interlayer insulating film IL6 and a passivation layer PT is formed on the seventh etching stopper layer ES7. As the material of the interlayer insulating film, a silicon oxide film having a dielectric constant lower than that of CVD silicon oxide, an organic insulating film and the like may be used in addition to silicon oxide. Both the organic insulating film and silicon oxide film may be used as lower level interlayer insulating films of a multi-layer wiring structure and higher level interlayer insulating films, respectively.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
   a semiconductor substrate;
   an element isolation trench defining an active region in said semiconductor substrate;
   a nitride film covering an inner wall of said element isolation trench and having a step making an upper portion of said nitride film from an intermediate depth of said inner wall thinner than a lower portion; and
   a high density plasma oxide film burying a space defined by said nitride film in said element isolation trench,
   wherein said upper portion of said nitride film has a first finite thickness larger than zero and being 7 nm or less, and said lower portion of said nitride film has a second finite thickness thicker than said first finite thickness.

2. The semiconductor device according to claim 1, wherein said high density plasma oxide film includes a first high density plasma oxide film burying a lower part of said space and a second high density plasma oxide film burying an upper part of said space on said first high density plasma oxide film.

3. The semiconductor device according to claim 1, further comprising an oxide liner film formed covering a surface of said element separation trench.

4. The semiconductor device according to claim 3, wherein said oxide liner film has a thickness of 5 nm or less.

5. The semiconductor device according to claim 4, wherein said oxide liner film has a top edge not retarded from a top edge of said nitride film.

6. The semiconductor device according to claim 1, further comprising a transistor formed in said active region.

7. The semiconductor device according to claim 1, wherein said nitride film has a tensile stress, and said high density plasma oxide film has a compressive stress.

8. The semiconductor device according to claim 1, wherein said nitride film has a top edge not retarded from a top surface of said high density plasma oxide film.

9. A semiconductor device comprising:

a semiconductor substrate;

an element isolation trench defining an active region in said semiconductor substrate;

a nitride film covering an entire area of inner wall of said element isolation trench and having a step making an upper portion of said nitride film from an intermediate depth of said inner wall thinner than a lower portion;

a high density plasma oxide film burying a space defined by said nitride film in said element isolation trench; and a MOS transistor formed in said active region, wherein said upper portion of said nitride film has a first finite thickness larger than zero and being 7 nm or less, and said lower portion of said nitride film has a second finite thickness thicker than said first finite thickness.

\* \* \* \* \*